(12) United States Patent
Heffels et al.

(10) Patent No.: US 10,883,694 B2
(45) Date of Patent: Jan. 5, 2021

(54) METHOD OF MANUFACTURING AN LED LIGHTING ASSEMBLY

(71) Applicant: Lumileds LLC, San Jose, CA (US)

(72) Inventors: Wilbert Heffels, Middelburg (NL); Piet Verburg, Goes (NL); Maurice Kuijpers, Vlissingen (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/348,859

(22) PCT Filed: Nov. 7, 2017

(86) PCT No.: PCT/EP2017/078435
§ 371 (c)(1),
(2) Date: May 9, 2019

(87) PCT Pub. No.: WO2018/087072
PCT Pub. Date: May 17, 2018

(65) Prior Publication Data
US 2020/0191353 A1  Jun. 18, 2020

(30) Foreign Application Priority Data
Nov. 14, 2016  (EP) ..................... 16198676

(51) Int. Cl.
*F21S 43/15* (2018.01)
*F21V 29/70* (2015.01)
(Continued)

(52) U.S. Cl.
CPC ................ *F21S 43/15* (2018.01); *F21S 4/24* (2016.01); *F21S 43/195* (2018.01); *F21S 45/47* (2018.01);
(Continued)

(58) Field of Classification Search
CPC ..... F21S 4/24–4/26; F21Y 2107/70–80; F21Y 2107/30
See application file for complete search history.

(56) References Cited

U.S. PATENT DOCUMENTS

| 2004/0037080 A1* | 2/2004 | Luk ........................ H05B 45/20 |
| | | 362/249.12 |
| 2004/0095078 A1* | 5/2004 | Leong ..................... F21K 9/278 |
| | | 315/291 |

(Continued)

FOREIGN PATENT DOCUMENTS

| DE | 20119861 U1 | 6/2002 |
| EP | 1612470 A2 | 1/2006 |

(Continued)

OTHER PUBLICATIONS

International Search Report, PCT/EP2017/078434, dated Dec. 20, 2017, 4 pgs.

*Primary Examiner* — Mariceli Santiago
(74) *Attorney, Agent, or Firm* — Volpe Koenig

(57) ABSTRACT

The invention describes a method of manufacturing an LED lighting assembly, which method comprises the steps of preparing a flexible carrier for a number of light-emitting diodes; mounting the light-emitting diodes onto the flexible carrier; providing a flexible shaping element made of a material that can be bent into a desired shape or form and incorporating a heat spreader; and winding the flexible carrier about the flexible shaping element in a helical manner. The invention further describes such an LED lighting assembly, and an LED lighting unit comprising such an LED lighting assembly.

13 Claims, 2 Drawing Sheets

(51) Int. Cl.
*F21S 4/24* (2016.01)
*F21S 45/47* (2018.01)
*F21S 43/19* (2018.01)
*H01L 23/538* (2006.01)
*H01L 25/075* (2006.01)
*H01L 33/62* (2010.01)
*H01L 33/64* (2010.01)
*F21Y 115/10* (2016.01)
*F21Y 107/70* (2016.01)

(52) U.S. Cl.
CPC .......... *F21V 29/70* (2015.01); *H01L 23/5387* (2013.01); *H01L 25/0753* (2013.01); *H01L 33/62* (2013.01); *H01L 33/647* (2013.01); *F21Y 2107/70* (2016.08); *F21Y 2115/10* (2016.08); *H01L 2933/0066* (2013.01); *H01L 2933/0075* (2013.01)

(56) References Cited

U.S. PATENT DOCUMENTS

| | | | |
|---|---|---|---|
| 2005/0162850 A1 | 7/2005 | Luk et al. | |
| 2008/0180949 A1* | 7/2008 | Liao | F21S 4/20 362/249.12 |
| 2010/0164409 A1* | 7/2010 | Lo | F21S 4/24 315/312 |
| 2011/0019433 A1* | 1/2011 | Dussault | F21S 4/24 362/555 |
| 2014/0268740 A1* | 9/2014 | Veres | F21V 29/70 362/235 |
| 2015/0260361 A1 | 9/2015 | Cho | |
| 2015/0285472 A1* | 10/2015 | Evitt | F21V 23/06 362/224 |
| 2017/0254518 A1* | 9/2017 | Vasylyev | G02B 6/0073 |

FOREIGN PATENT DOCUMENTS

| | | |
|---|---|---|
| EP | 2292970 A2 | 3/2011 |
| JP | 2009037795 A | 2/2009 |

* cited by examiner

METHOD OF MANUFACTURING AN LED LIGHTING ASSEMBLY

FIELD OF THE INVENTION

The invention describes a method of manufacturing an LED lighting assembly, an LED lighting assembly, and an LED lighting unit.

BACKGROUND OF THE INVENTION

Light emitting diodes (LEDs) are used in a wide variety of lighting applications. One or more LEDs can be connected, for example in a series arrangement, and driven by a power source. Usually, LED dies or chips are mounted on a carrier such as a printed circuit board (PCB) that has been prepared to include conductive tracks and contact regions so that, when the LED dies are mounted in place, the LEDs are connected in an electrical circuit. A PCB for an LED lighting application is generally made of a robust material such as a fibreglass laminate, and is usually mounted onto a heat spreader that dissipates the heat from the LEDs during operation. When multiple LEDs are used, the positions of the LEDs on the PCB determine the shape of the light source. A disadvantage of this type of construction is that at least the PCB must be engineered and manufactured for each specific lighting unit. A PCB and heat spreader arrangement that is shaped to suit one type of LED lighting application may be completely unsuitable for another LED lighting application, even if these LED lighting applications are very similar. This adds significantly to the costs of developing a range of lighting products.

Therefore, it is an object of the invention to provide a more economical way of manufacturing an LED lighting assembly.

SUMMARY OF THE INVENTION

According to the invention, the method of manufacturing an LED lighting assembly comprises the steps of preparing a flexible carrier for a number of light-emitting diodes; mounting the light-emitting diodes onto the flexible carrier; providing a flexible shaping element made of a material that can be bent into a desired shape or form; incorporating a heat spreader in the flexible shaping element; and winding the flexible carrier about the flexible shaping element in a helical manner.

An advantage of the inventive method is that it allows a wide variety of LED lighting units to be assembled using a single carrier design. For example, the carrier can be a long strip with a fixed width, and the LEDs can be mounted onto the carrier at a fixed offset or pitch. A set of LEDs mounted onto the flexible carrier will act as a light source when connected to a power supply. In the inventive method, by winding or wrapping the carrier around different kinds of flexible shaping elements, a single carrier design can be used to achieve differently-shaped LED light sources for use in different LED lighting applications.

According to the invention, the LED lighting assembly comprises a flexible shaping element incorporating a heat spreader, and a number of light-emitting diodes mounted onto a flexible carrier. The flexible carrier is wound in a helical manner about the flexible shaping element. In this way, the inventive LED lighting assembly effectively provides a single type of assembly that can be used in a wide range of models or applications.

The inventive LED lighting unit comprises such an LED lighting assembly arranged in a container, which container comprises a number of partially reflective side walls and a light exit opening defined by the side walls, and wherein the LED lighting assembly is embedded in a translucent flexible material. Since the shaping element is flexible and can have any desired form, and the flexible carrier can be arranged around the flexible shaping element in any number of ways, the range of possible designs for the inventive LED lighting unit is essentially unlimited. An advantage of the inventive LED lighting unit is that it can be used without modification by different manufacturers to provide various different types of LED lighting unit.

The dependent claims and the following description disclose particularly advantageous embodiments and features of the invention. Features of the embodiments may be combined as appropriate. Features described in the context of one claim category can apply equally to another claim category.

The "carrier" can be any structure that is used to connect one or more LEDs in an electrical circuit. Preferably, the flexible carrier is a thin printed circuit board (PCB) with a high degree of flexibility. Such a thin PCB can be flexed or bent to assume a curved shape. In a preferred embodiment of the invention, the flexible carrier is prepared by attaching a copper foil to a plastic film such as polyimide. The thickness of the copper foil or the plastic film can be in the region of 30 μm 100 μm (micrometres). To form the conductive tracks that will later connect the LEDs in an electric circuit, a photosensitive mask is applied to the copper surface. After developing the mask, the copper layer is etched to the desired shape, for example to form tracks extending between electrode contact regions, wherein anode and cathode contact regions are formed on either side of a mounting region shaped to receive an LED die.

The LED dies can be mounted into place and then bonded to the tracks, for example using wire bonds. In a preferred embodiment of the invention, a coating is applied over the LED dies and the flexible carrier. The coating can serve as a layer to protect the LEDs and wire bonds. The coating can also be reflective in order to achieve a favourable light output for a lighting unit that incorporates that LED lighting assembly.

LEDs give off heat during operation. Particularly in the case of power LEDs that are used to achieve very bright light sources, it is important to ensure that the LEDs do not become too hot, since high temperatures can detract from the performance of the LEDs and can shorten the lifetime of the lighting unit. Therefore, in a particularly preferred embodiment of the invention, the flexible shaping element includes a heat spreader arranged in close proximity to the LEDs. For example, a wire coil or band can be wrapped around a flexible supporting element so that the wire coil or band is directly underneath the flexible carrier to dissipate heat from the LEDs during operation. Of course, the heat spreader can have any suitable shape or form, for example it may be realised as a tube or half-pipe to fully or partially enclose the flexible supporting element. Preferably, the flexible supporting element can also dissipate heat. The supporting element can be a rod, a bar, or any suitably shaped component.

The flexible carrier is wound or wrapped around the flexible shaping element in a helical fashion, and the helical winding pitch will effectively determine the positions of the LEDs that are mounted on the flexible carrier. Therefore, in a preferred embodiment of the invention, the winding step is preceded by a step of determining a winding pitch or helix pitch to achieve a desired LED arrangement after winding.

Preferably, the helix pitch is determined on the basis of the dimensions of the flexible shaping element and/or the dimensions of the flexible carrier. Preferably, the mounting regions for the LED dies are shaped to take into account the pitch of the flexible carrier after this is wrapped around the flexible shaping element. A die mounting region is essentially an empty rectangular or square space bounded on two sides by an anode contact region and a cathode contact region. Skewed mounting regions can be formed on the flexible carrier so that the LEDs assume an essentially "upright" orientation after winding. For example, a track running essentially parallel to the edge of the flexible PCB can terminate in a slanted anode contact region. The track resumes at a correspondingly shaped slanted cathode region on the other side of the die mounting region.

Of course, the flexible carrier can also be designed with a variety of possible LED arrangements in mind. For example, it may be desired to achieve a linear arrangement of LEDs, in which the LEDs appear to be arranged along a common line. It may be desired to achieve a straight linear arrangement or a curved linear arrangement, depending on the shape and design of the housing unit that will be used to contain the LED lighting assembly, for example. Therefore, in a preferred embodiment of the invention, the method comprises a step of determining a mounting pitch between the light-emitting diodes on the basis of a desired LED arrangement after winding. The mounting pitch may be understood as the distance between adjacent LEDs when mounted on to the flexible carrier. The mounting pitch may be constant for a flexible carrier design. For example, the same flexible carrier design can be used to construct a "short" lighting unit and a "long" lighting unit, simply by winding a short length of flexible carrier (with a relatively small number of LEDs) around a short flexible shaping element, and winding a long length of flexible carrier (with a higher number of LEDs) around a longer flexible shaping element. When the same type of flexible shaping element is used, the distances between the LEDs in their wound positions can be essentially the same for both "short" and "long" realizations, resulting in lighting units of different lengths but with essentially similar appearance. Of course, the mounting pitch may also vary along a single flexible carrier embodiment, for example if the flexible shaping element is to have an irregular or complex shape.

A flexible carrier can be prepared to carry a single set of LEDs. Equally, a single flexible carrier can be prepared to carry two or more sets of LEDs. For example, when it is to be used in an automotive rear lighting unit, the LED lighting assembly can use a flexible carrier that comprises tracks for a set of red LEDs and separate tracks for a set of yellow LEDs. An LED lighting assembly with multiple sets of LEDs can be achieved by forming two or more sets of tracks on the flexible carrier, as well as an appropriate arrangement of mounting regions as described above to receive the LED dies. The mounting pitch and the winding pitch of a flexible carrier can be determined to achieve the desired arrangement of LEDs for the LED sets. Alternatively or in addition, two or more flexible carriers can be wound around a single flexible shaping element to achieve a desired LED configuration.

The flexible shaping element itself can be a rod or bar, or any suitable component with the appropriate dimensions. In a preferred embodiment of the invention, the shaping element is made of a material that can be bent into a desired shape or form. Manipulating the LED lighting assembly in this way can be done before the winding step or after the winding step, as appropriate. For example, the inventive LED lighting assembly can be prepared by winding a wire coil about a flexible rod to form the flexible shaping element, winding the flexible carrier about the flexible shaping element, and then bending the entire LED lighting assembly into the desired shape before inserting it into a housing of a lighting unit. In this way, one type of previously prepared LED lighting assembly can easily be adapted to differently-shaped housings.

A homogenous light output may be desired in a lighting application using the inventive LED lighting assembly. However, a linear arrangement of LEDs will generally appear as a string of separate light sources. Therefore, in a preferred embodiment of the invention, the method comprises a step of encasing the helically wound carrier and the light-emitting diodes in a translucent flexible material, so that a layer of the translucent flexible material covers at least the LEDs of the LED lighting assembly. Scattering particles can be suspended in the translucent flexible material to achieve a satisfactorily homogenous light output. An appropriate choice of material may be silicone, for example. This can be poured over the LED lighting assembly arranged in a mould, and then cured to set the silicon using any suitable curing technique. The "mould" can be a housing of a lighting unit, shaped to receive the LED lighting assembly. Such a housing can be referred to as a container or mixing box, and preferably comprises reflective side walls, and a light exit opening defined by the side walls. The inventive LED lighting assembly can be arranged to lie on the "floor" or base of the container, and is preferably embedded in the translucent flexible material as described above. Such an arrangement results in a light source that can have the appearance of a straight or curved strip, with a favourably homogenous light output.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
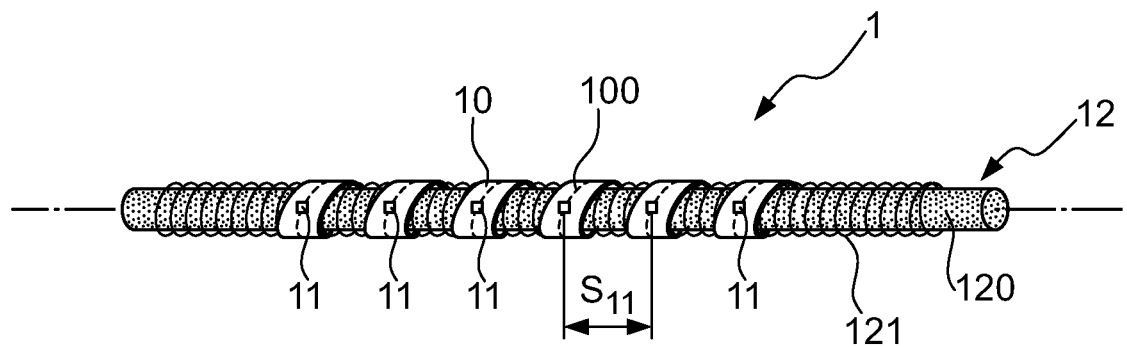
FIG. 1 shows an embodiment of the inventive LED lighting assembly.
Figure 2:
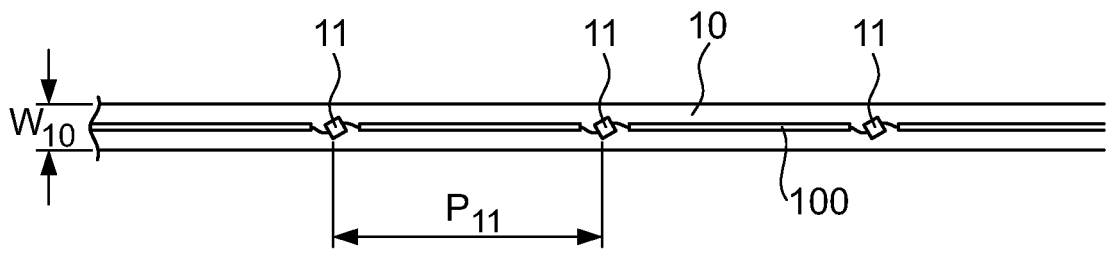
FIG. 2 shows a flexible carrier of the LED lighting assembly of FIG. 1.
Figure 3:
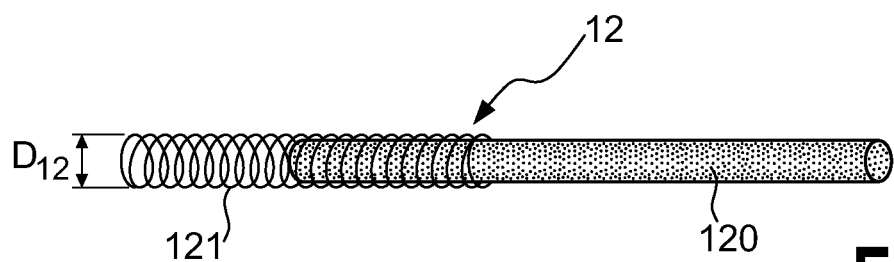
FIG. 3 shows a flexible shaping element of the LED lighting assembly of FIG. 1.

FIG. 1 shows an embodiment of the inventive LED lighting assembly 1. The diagram shows a flexible PCB carrier 10 that has been wound about a flexible core 12. The LEDs 11 are electrically connected by conductive tracks 100 formed in or on the flexible PCB 10, and can be controlled as a single light source. The flexible core 12 comprises a metal coil 121, wrapped about a rod 120 of flexible material such as silicone rubber foam rubber, or any other inherently flexible material. The core 12 is therefore inherently flexible, and the metal coil 121 will act as an efficient heat spreader during operation of the LEDs 11. The linear arrangement of LEDs 11 as shown in the diagram can be achieved by appropriate choice or adjustment of various parameters such as the diameter of the flexible core 12 and the offset distance $S_{11}$ between adjacent LED dies 11. For example, a flexible carrier 10 can be prepared to have a certain LED mounting pitch $P_{11}$ or carrier offset $P_{11}$ as shown in FIG. 2. A flexible core 12 can be assembled, as shown in FIG. 3, by inserting a flexible rod 120 into a previously prepared wire coil 121, or by winding such a wire around the flexible rod 120. The width $W_{10}$ of the flexible PCB 10 will determine the smallest achievable offset distance or winding pitch $S_{11}$ between the LEDs 11 for that flexible carrier 10. The LED winding pitch $S_{11}$ can be increased by choosing an appropriate diameter Die for the core 12 and/or by winding the flexible carrier 10 around the flexible core 12 using an appropriate helical pitch. Therefore, even when the LED mounting pitch $P_{11}$ and the core diameter $D_{12}$ are fixed, it is still possible to achieve various different arrangements of the LEDs 11. For example, it is possible to achieve different linear arrangements of LEDs 11, each having a different winding pitch or mounting offset $S_{11}$. Alternatively, the core diameter $D_{12}$ and/or the carrier width $W_{10}$ and/or the mounting offset Sit can be chosen to achieve a certain helical arrangement of LEDs 11 in the wound state.

Figure 4:
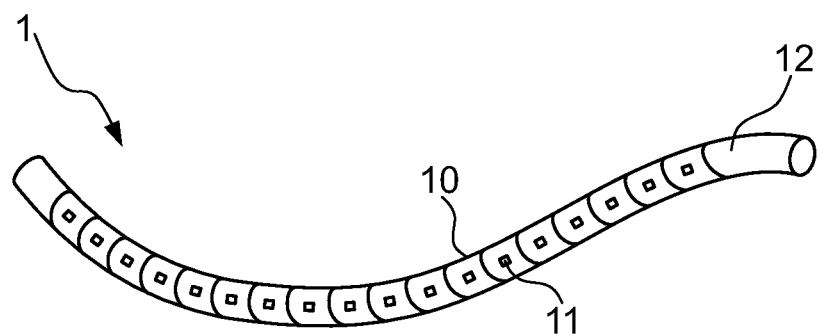
FIG. 4 shows a further embodiment of the inventive LED lighting assembly.

FIG. 4 shows another embodiment of the inventive LED lighting assembly 1. The mounting offset $S_{11}$ and core diameter $D_{12}$ have been chosen to achieve a linear LED arrangement after winding the flexible carrier 10 about the flexible core 12 in a helical fashion. In this embodiment, the flexible core 12 has been brought into a curved shape. This shaping of the flexible core 12 can have been done prior to or after the winding step.

Figure 5:
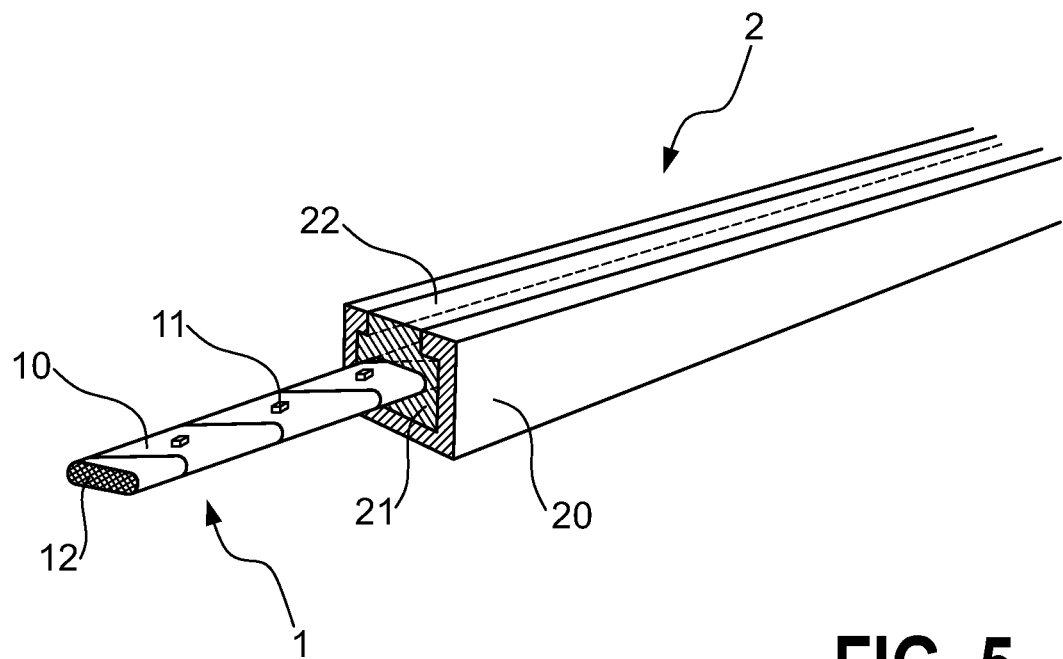
FIG. 5 shows an embodiment of the inventive LED lighting unit.

FIG. 5 is a cut-away diagram of an embodiment of the inventive LED unit 2. Here, an LED lighting assembly 1 has been manufactured using the inventive method, by winding a flexible carrier 10 around a flexible core 12. In this exemplary embodiment, the flexible core 12 is shaped like a bar and has an oblong cross-section, and can comprise a heat spreader arranged about the flexible bar. A flexible PCB carrier 10 has been helically wound around the flexible core 12 to achieve a linear arrangement of LEDs 11. The LED lighting assembly 1 is arranged in a mixing box 20 or container 20 and is embedded in a translucent filler 21 such as silicone. The filler 21 can comprise a suspension of scattering particles to achieve a homogenous light output at the light exit opening 22 of the container 20. The diagram shows a straight-walled container 20, but it shall be understood that the container 20 can have a curved shape to contain a curved LED lighting assembly 1 of the type described in FIG. 4 above.

Figure 6:
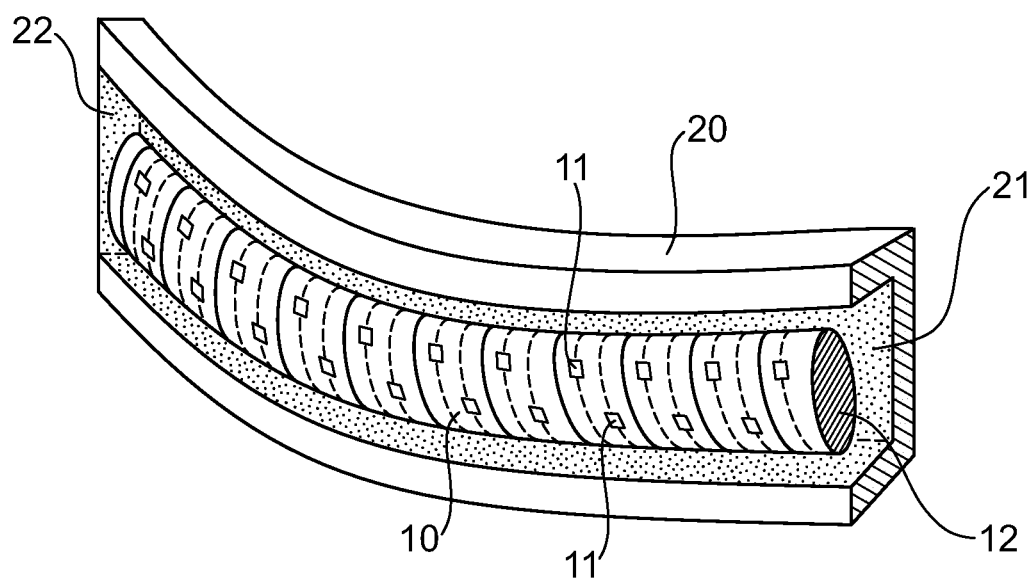
FIG. 6 shows a further embodiment of the inventive LED lighting unit.

FIG. 6 shows such an embodiment of an LED lighting unit 2. Here, a container 20 or housing 20 has a curved shape and is part of a curved automotive rear lighting unit. An LED lighting assembly 1 is arranged in the container 20 and embedded in a translucent filler 21. In this exemplary embodiment, the flexible carrier 10 has been prepared to provide tracks for several independently controllable sets of LEDs 11. One set of LEDs the lower row, for example can comprise red LEDs 11 that will be controlled as a rear light and/or as a brake light; another set of LEDs the upper row for example can comprise yellow LEDs 11 that will be controlled as an indicator light. A further set of LEDs could easily be included, for example white LEDs that could be controlled as a reverse light. A flexible carrier 10 comprising tracks (indicated by the broken lines) for the sets of independently controllable LEDs 11 is wound around a flexible core 12 as described above. Because of the many possibilities of adjusting a variable parameter (e.g. winding pitch, core diameter) to an essentially fixed parameter (e.g. LED mounting offset, PCB width), it is possible to use a single carrier design to manufacture a wide variety of such lighting units 2 having distinctly different appearances and/or functions.

Although the present invention has been disclosed in the form of preferred embodiments and variations there on, it will be understood that numerous additional modifications and variations could be made thereto without departing from the scope of the invention. For example, "intelligent" or programmable LEDs can be used in an embodiment of the inventive LED lighting assembly. Such programmable LEDs can be controlled to create moving light patterns, for instance. A specific moving light pattern or lighting sequence can be achieved by switching on/off the programmable LEDs in an appropriate manner.

For the sake of clarity, it is to be understood that the use of "a" or "an" throughout this application does not exclude a plurality, and "comprising" does not exclude other steps or elements.

The invention claimed is:

1. A method of manufacturing an LED lighting assembly, the method comprising:
preparing a flexible carrier for a number of light-emitting diodes;
mounting the light-emitting diodes onto the flexible carrier;
providing a flexible shaping element made of a material that can be bent into a desired shape or form and comprising a heat spreader;
winding a wire coil around a supporting element of flexible material such that the wire coil can dissipate heat from the light-emitting diodes during operation; and
winding the flexible carrier about the flexible shaping element in a helical manner.

2. The method according to claim 1, further comprising determining a winding pitch to achieve a desired LED arrangement after winding.

3. The method according to claim 2, wherein the winding pitch is determined on the basis of at least one of the dimensions of the flexible shaping element and the dimensions of the flexible carrier.

4. The method according to claim 1, wherein preparing the flexible carrier comprises determining a mounting pitch between the light-emitting diodes on the basis of a desired LED arrangement after winding.

5. The method according to claim 1, further comprising applying a protective coating over the light-emitting diodes and the flexible carrier prior to winding the flexible carrier.

6. The method according to claim 1, further comprising encasing the helically wound carrier and the light-emitting diodes in a translucent flexible material.

7. An LED lighting assembly comprising:
a flexible shaping element made of a material that can be bent into a desired shape or form, the flexible shaping element comprising a longitudinal supporting element and a wire coil wrapped around the longitudinal support element, and the flexible shaping element further comprising a heat spreader; and a number of light-emitting diodes mounted onto a flexible carrier, the flexible carrier being wound in a helical manner about the flexible shaping element.

8. The LED lighting assembly according to claim 7, wherein the flexible carrier provides tracks for two or more sets of independently controllable light-emitting diodes.

9. The LED lighting assembly according to claim 7, further comprising two or more flexible carriers wound about a shared flexible shaping element.

10. The LED lighting assembly according to claim 7, wherein the longitudinal supporting element is made of silicone rubber.

11. The LED lighting assembly according to claim 7, wherein the flexible carrier is wound around the flexible shaping element to achieve a linear arrangement of LEDs.

12. An LED lighting unit comprising:
an LED lighting assembly arranged in a container,
the LED lighting assembly comprising a flexible shaping element made of a material that can be bent into a desired shape or form, the flexible shaping element comprising a longitudinal supporting element and a wire coil wrapped around the longitudinal support element, and the flexible shaping element further comprising a heat spreader;
a number of light-emitting diodes mounted onto a flexible carrier,
the flexible carrier is being wound in a helical manner about the flexible shaping element, and
the container comprising a number of partially reflective side walls and a light exit opening defined by the side walls, and the LED lighting assembly being embedded in a translucent flexible material.

13. The LED lighting unit according to claim 12, realized as an automotive rear lighting unit, wherein the flexible carrier comprises tracks for independently controllable sets of red light-emitting diodes and yellow light-emitting diodes mounted on the flexible carrier.

* * * * *